(12) United States Patent
Lin et al.

(10) Patent No.: US 9,070,829 B2
(45) Date of Patent: Jun. 30, 2015

(54) LIGHT EMITTING DIODE CHIP AND METHOD FOR MANUFACTURING THE SAME

(71) Applicant: ADVANCED OPTOELECTRONIC TECHNOLOGY, INC., Hsinchu Hsien (TW)

(72) Inventors: Ya-Wen Lin, Hsinchu (TW); Ching-Hsueh Chiu, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/014,409

(22) Filed: Aug. 30, 2013

(65) Prior Publication Data

US 2014/0183445 A1 Jul. 3, 2014

(30) Foreign Application Priority Data

Dec. 29, 2012 (CN) .......................... 2012 1 0587681

(51) Int. Cl.
*H01L 33/00* (2010.01)
*H01L 33/34* (2010.01)
*H01L 33/04* (2010.01)
*H01L 33/14* (2010.01)

(52) U.S. Cl.
CPC ............. *H01L 33/34* (2013.01); *H01L 33/0054* (2013.01); *H01L 33/04* (2013.01); *H01L 33/002* (2013.01); *H01L 33/14* (2013.01)

(58) Field of Classification Search
CPC ... H01L 33/00; H01L 33/002; H01L 33/0054; H01L 33/04; H01L 33/34
See application file for complete search history.

(56) References Cited

U.S. PATENT DOCUMENTS

| 8,569,736 | B2 | 10/2013 | Wei et al. | |
| 2010/0221852 | A1* | 9/2010 | Li et al. | 438/22 |
| 2012/0001218 | A1* | 1/2012 | Choi et al. | 257/98 |
| 2012/0175742 | A1* | 7/2012 | Wei et al. | 257/618 |
| 2013/0285105 | A1* | 10/2013 | Wei et al. | 257/99 |
| 2013/0285289 | A1* | 10/2013 | Feng et al. | 264/400 |

FOREIGN PATENT DOCUMENTS

| TW | 201034248 A1 | 9/2010 |
| TW | 201244168 A1 | 11/2012 |

* cited by examiner

*Primary Examiner* — Peniel M Gumedzoe
(74) *Attorney, Agent, or Firm* — Novak Druce Connolly Bove + Quigg LLP

(57) ABSTRACT

An LED package includes a substrate, a buffer layer formed on the substrate, an epitaxial structure formed on the buffer layer, and a plurality of carbon nanotube bundles formed in the epitaxial structure.

11 Claims, 11 Drawing Sheets

LIGHT EMITTING DIODE CHIP AND METHOD FOR MANUFACTURING THE SAME

BACKGROUND

1. Technical Field

The disclosure relates generally to light emitting devices, and more particularly to a light emitting diode (LED) chip and a method for manufacturing the same.

2. Description of Related Art

Nowadays light emitting diodes (LEDs) are used widely in various applications for illumination. There are two types of LED chips available in typical LEDs, a lateral LED chip and a vertical LED chip. The vertical LED chip generally includes a conductive substrate, an N-type semiconductor layer formed on the substrate, a light emitting layer formed on the N-type semiconductor layer, a p-type semiconductor layer formed on the light emitting layer, and a P-type electrode formed on the P-type semiconductor layer. In operation, current flows from the P-type electrode to the substrate, thereby activating the light emitting layer to emit light.

However, the P-type electrode has a smaller surface area less than that of the P-type semiconductor layer, and only covers a central area of the P-type semiconductor layer. The current flowing through the chip is prone to converge at a central portion of the chip corresponding to the P-type electrode. Thus, more current flows through the central portion of the chip than two lateral portions of the chip. As a result, the chip cannot emit light with uniform intensity due to uneven distribution of the current within the chip.

What is needed is an improved LED chip which can overcome the limitations described, and a method for manufacturing the LED chip.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
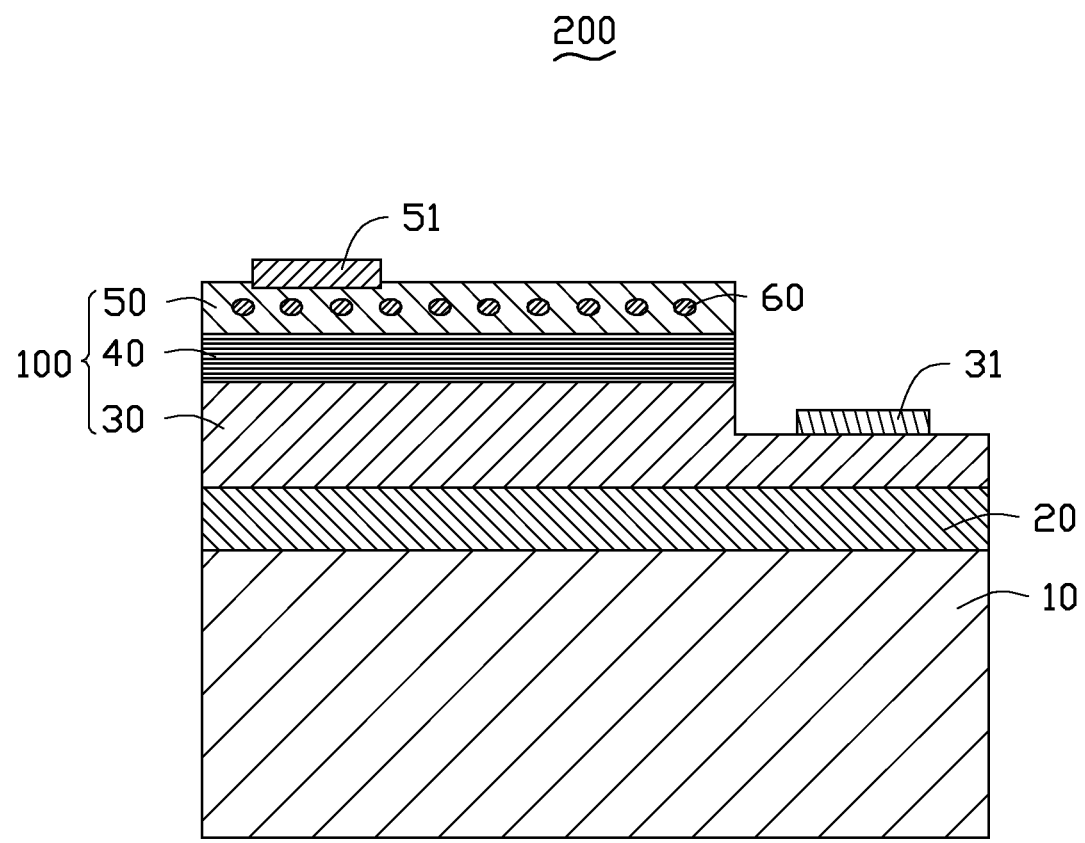
FIG. 1 is a schematic, cross-sectional view of an LED chip according to an exemplary embodiment of the present disclosure.

Referring to FIG. 1, a light emitting diode (LED) chip 200 in accordance with an exemplary embodiment of the present disclosure is illustrated. The light emitting diode chip 200 includes a substrate 10, a buffer layer 20 formed on the substrate 10, and an epitaxial structure 100 formed on the buffer layer 20. The epitaxial structure 100 includes a first semiconductor layer 30, a second semiconductor layer 50, and an active layer 40 sandwiched between the first semiconductor layer 30 and the second semiconductor layer 50.

A first electrode 31 is further formed on the first semiconductor layer 30. A plurality of carbon nanotube bundles 60 are formed in the second semiconductor layer 50. A second electrode 51 is further formed on the second semiconductor layer 50. The second electrode 51 electrically connects with the carbon nanotube bundles 60.

The substrate 10 is made of $Al_2O_3$, silicon, SiC, ceramic, polymer, GaN or ZnO.

The buffer layer 20 is made of GaN or AlN. The buffer layer 20 decreases lattice mismatch existed between the epitaxial structure 100 between and the substrate 10, whereby subsequent growth of the epitaxial structure 100 can obtain an excellent epitaxial structure.

The first semiconductor layer 30, the active layer 40 and the second semiconductor layer 50 are formed on the buffer layer 20 in sequence. In the embodiment of this disclosure, the first semiconductor layer 30 is an N-type semiconductor layer, and the second semiconductor layer 50 is a P-type semiconductor layer. The active layer 40 is made of InN, InGaN, GaN, AlGaN, InGaAlN or other suitable light emitting materials.

Figure 2:
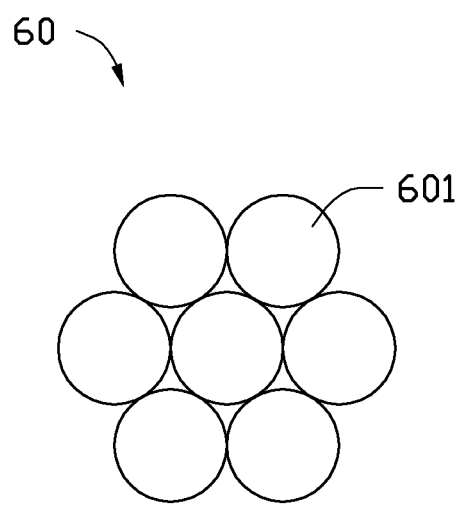
FIG. 2 is a schematic view of a carbon nanotube bundle of the LED chip of FIG. 1.
Figure 3:
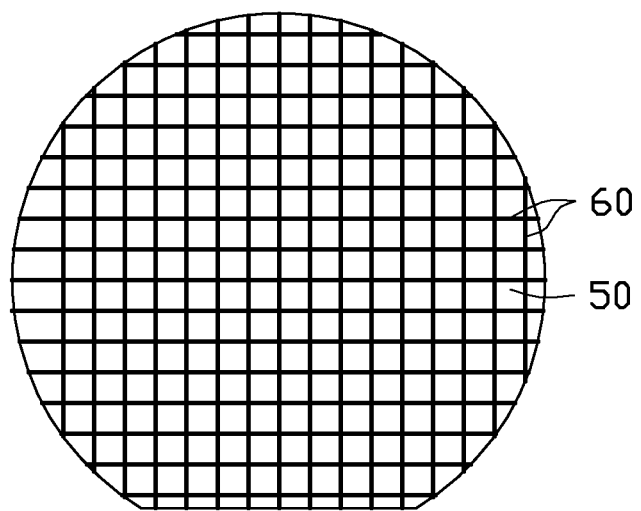
FIG. 3 is a schematic view of arrangement of a plurality of carbon nanotube bundles of the LED chip of FIG. 1.

Referring to FIGS. 2-3 also, the carbon nanotube bundles 60 are embedded into the second semiconductor layer 50. Each of the carbon nanotube bundles 60 includes a plurality of carbon nanotubes 601. Each carbon nanotube 601 is a single-walled carbon nanotube or a multi-walled carbon nanotube. A diameter of each carbon nanotube 601 is ranged from 2 nm to 20 nm. The carbon nanotube bundles 60 are staggered in lines and rows to form a net structure.

Figure 4:
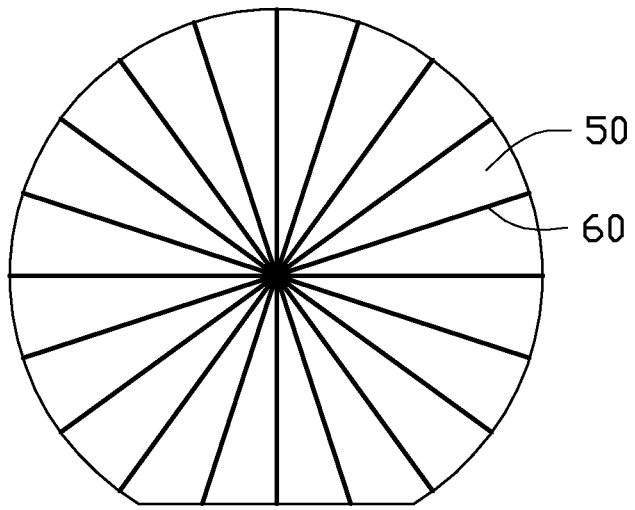
FIG. 4 is a schematic view of alternative arrangement of a plurality of carbon nanotube bundles of the LED chip of FIG. 1.
Figure 5:
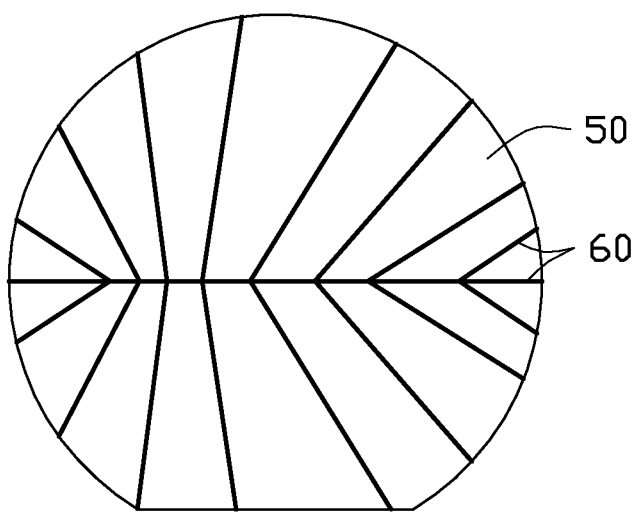
FIG. 5 is a schematic view of another alternative arrangement of a plurality of carbon nanotube bundles of the LED chip of FIG. 1.
Figure 6:
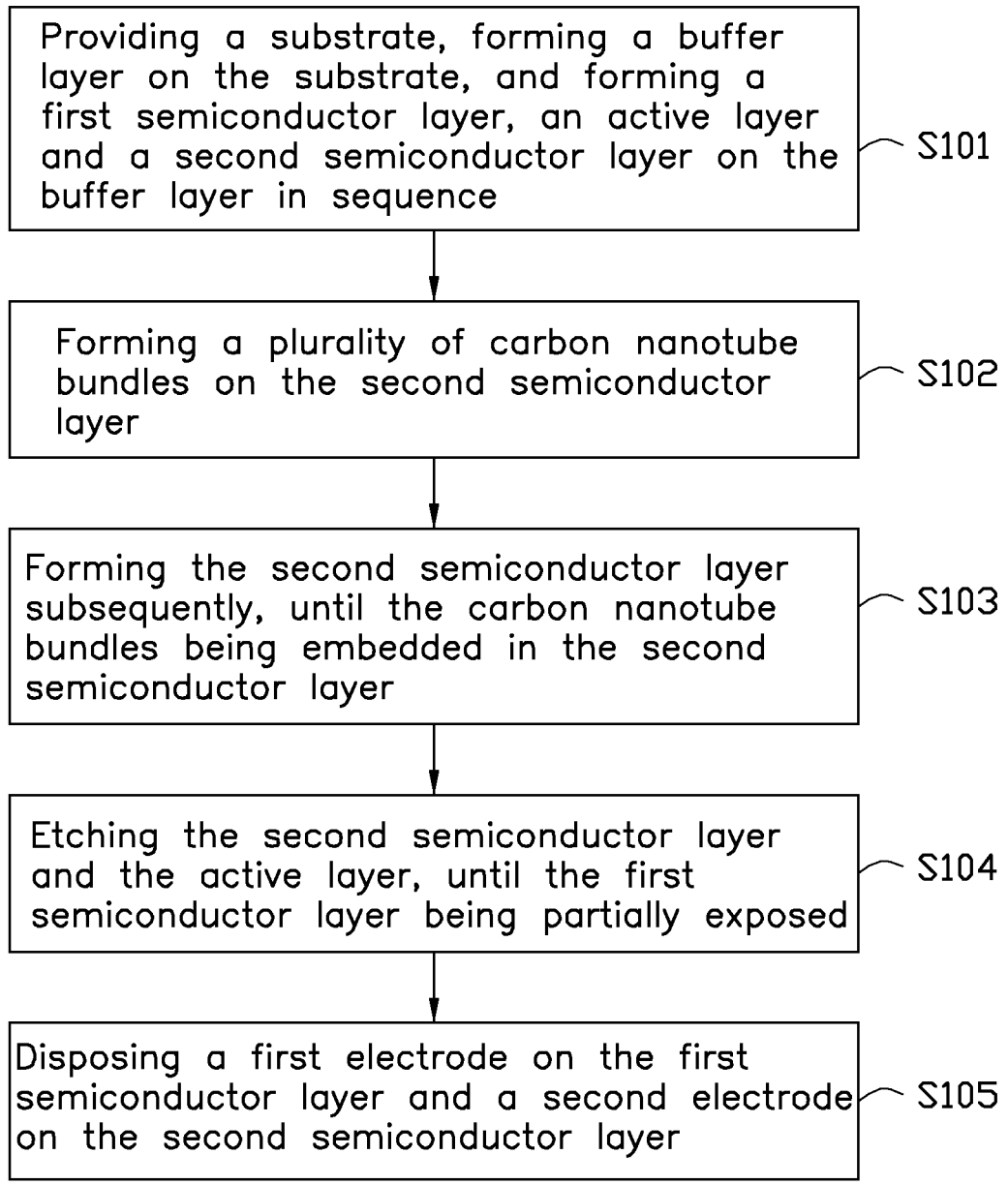
FIG. 6 is a flow chart showing a method for manufacturing the LED chip of the present disclosure
Figure 7:
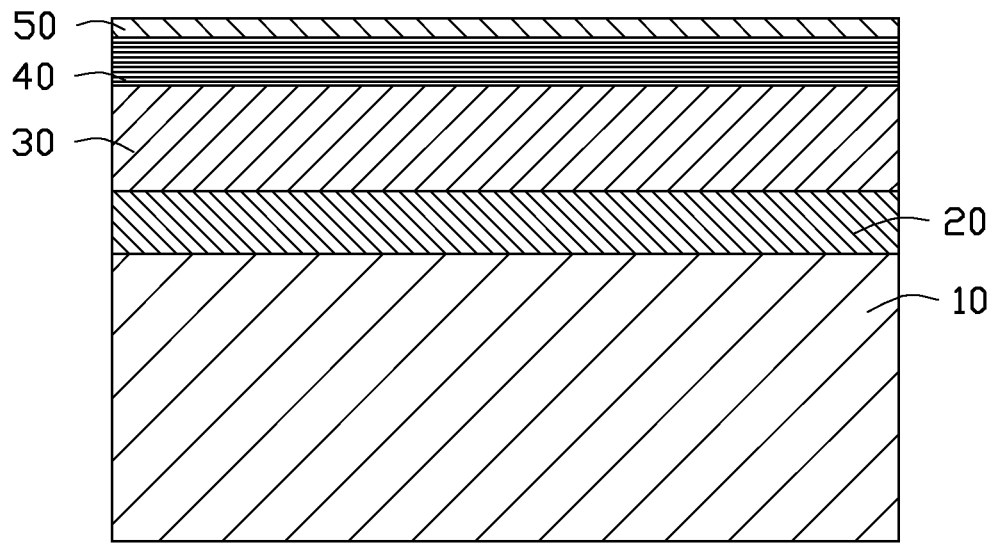
FIGS. 7 to 11 show steps of the method for manufacturing the LED package of FIG. 6, respectively.
Figure 8:
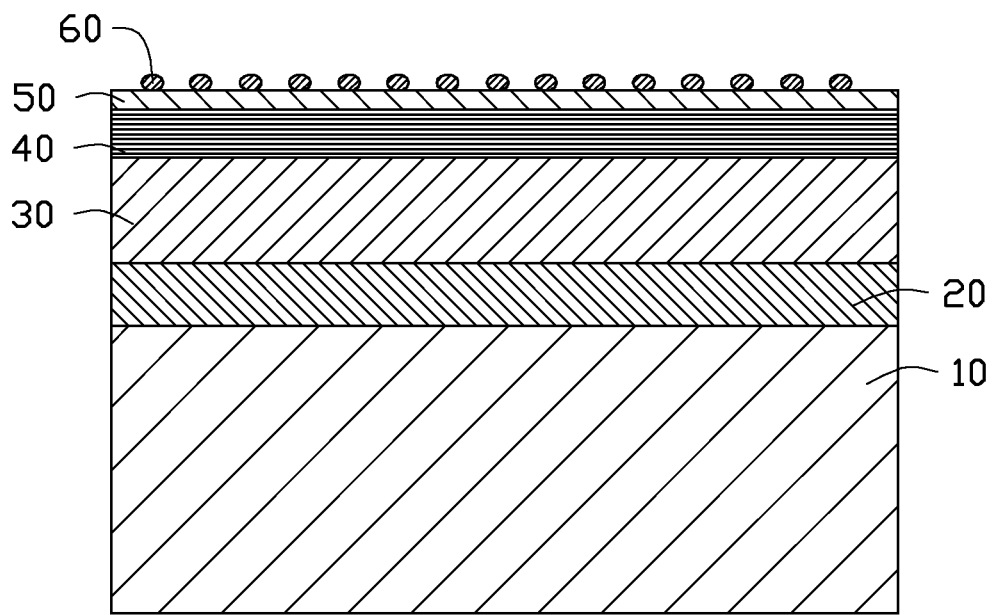
Figure 9:
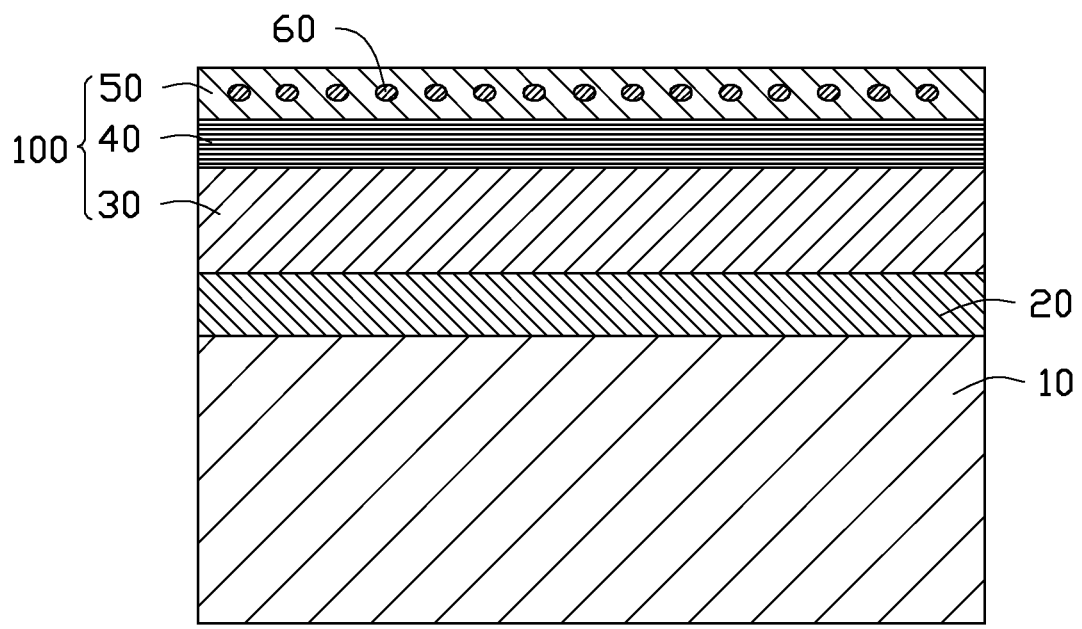
Figure 10:
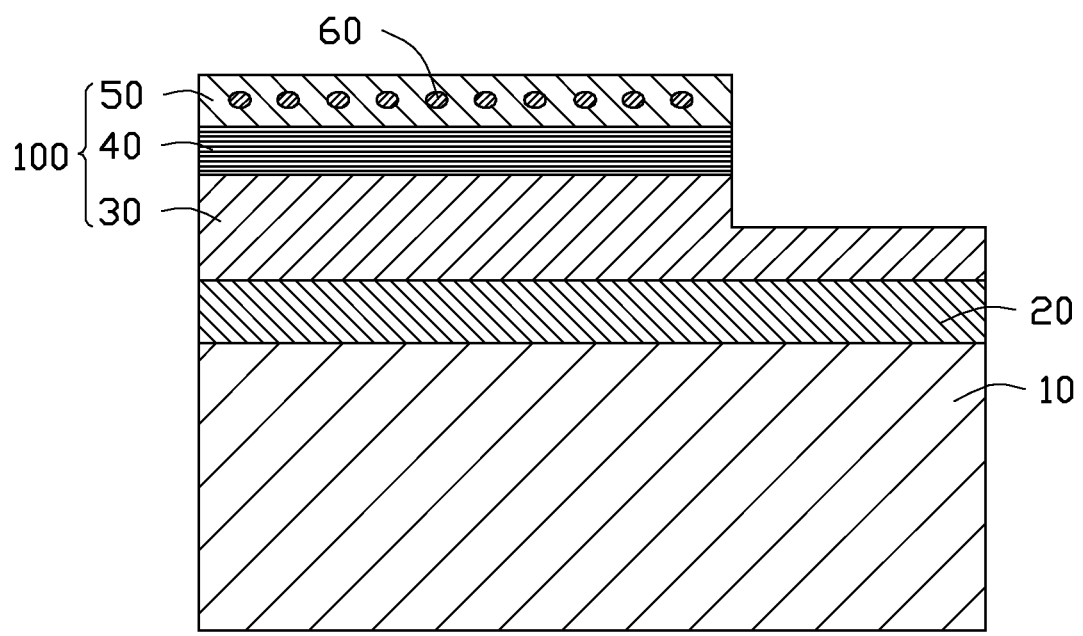
Figure 11:
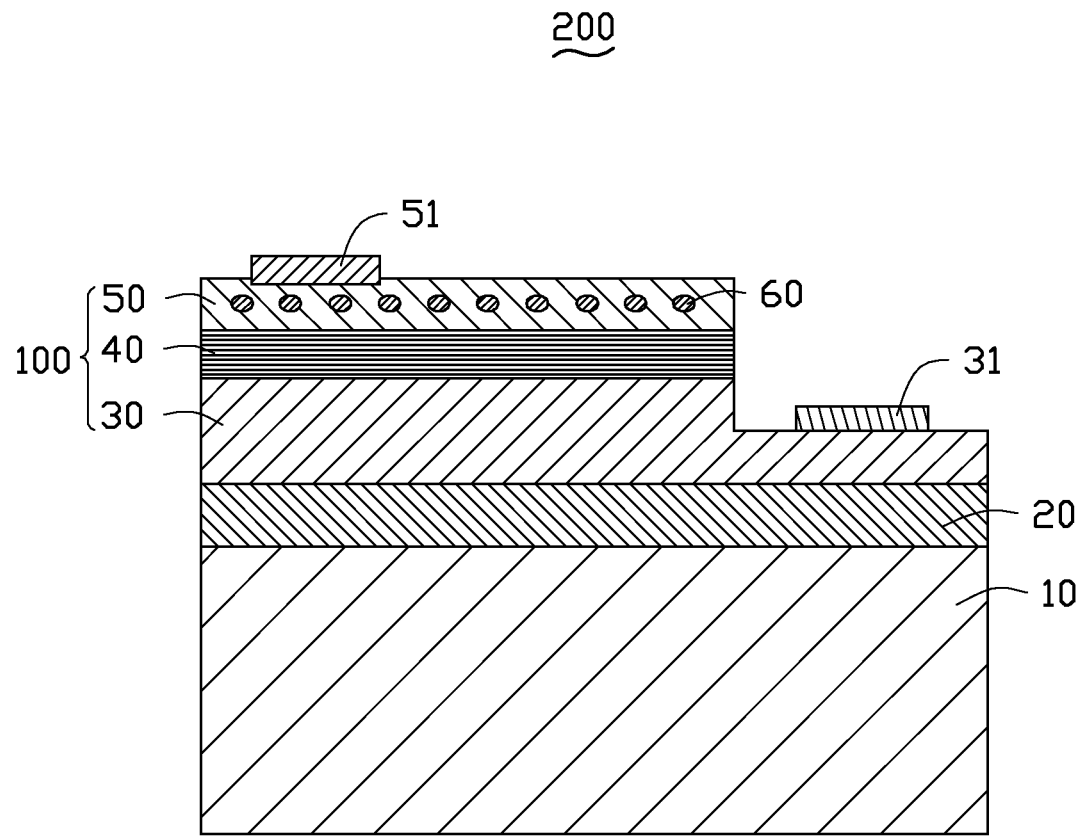

It can be understood that, alternatively, the carbon nanotube bundles 60 are arranged radially (as shown in FIG. 4), or the carbon nanotube bundles 60 are arranged fishbone-like (as shown in FIG. 5).

The carbon nanotube bundles 60 are arranged in a single plane. Alternatively, the carbon nanotube bundles 60 are arranged in multiple planes staggered with each other, respectively.

Referring to FIGS. 6-11, the disclosure further provides a method for manufacturing the light emitting diode chip 200.

Step 101, a substrate 10 is provided, a buffer layer 20 is formed on the substrate 10, and a first semiconductor layer 30, an active layer 40 and a second semiconductor layer 50 are formed on the buffer layer 20 in sequence.

Step 102, a plurality of carbon nanotube bundles 60 are formed on the second semiconductor layer 50.

Step 103, the second semiconductor layer 50 is sequentially formed until the carbon nanotube bundles 60 are embedded m the second semiconductor layer 50

Step 104, the second semiconductor layer 50 and the active layer 40 are etched, and the first semiconductor layer 30 is partially exposed.

Step 105, a first electrode 31 and a second electrode 51 are provided, the first electrode 31 is fixed on the first semiconductor layer 30, and the second electrode 51 is fixed on the second semiconductor layer 50.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED (light emitting diode) chip, comprising:
a substrate;
a buffer layer formed on the substrate;
an epitaxial structure formed on the buffer layer; and
a plurality of carbon nanotube bundles formed in the epitaxial structure;
wherein the carbon nanotube bundles are arranged radially, and each carbon nanotube bundle is intersected with others at an edge thereof.

2. The LED chip of claim 1, wherein the epitaxial structure comprises a first semiconductor layer, a second semiconductor layer, and an active layer sandwiched between the first semiconductor layer and the second semiconductor layer.

3. The LED chip of claim 2, wherein the carbon nanotube bundles are embedded in the second semiconductor layer.

4. The LED chip of claim 1, further comprising a first electrode fixed on the first semiconductor layer, and a second electrode fixed on the second semiconductor layer.

5. The LED chip of claim 4, wherein the second electrode electrically connects with the carbon nanotube bundles.

6. The LED chip of claim 1, wherein the carbon nanotube bundles are arranged in a single plane.

7. The LED chip of claim 1, wherein each of the carbon nanotube bundles comprises a plurality of carbon nanotubes, and each carbon nanotube is a single-walled carbon nanotube or a multi-walled carbon nanotube.

8. The LED chip of claim 1, wherein a diameter of each carbon nanotube in the plurality of carbon nanotube bundles is ranged from between 2 nm to 20 nm.

9. The LED chip of claim 5, wherein the epitaxial structure comprises a first semiconductor layer, a second semiconductor layer, and an active layer sandwiched between the first semiconductor layer and the second semiconductor layer.

10. The LED chip of claim 5, wherein each of the carbon nanotube bundles comprises a plurality of carbon nanotubes, and each carbon nanotube is a single-walled carbon nanotube or a multi-walled carbon nanotube.

11. The LED chip of claim 5, wherein a diameter of each carbon nanotube in the plurality of carbon nanotube bundles is ranged from between 2 nm to 20 nm.

\* \* \* \* \*